(12) United States Patent
Smith

(10) Patent No.: US 7,765,503 B2
(45) Date of Patent: Jul. 27, 2010

(54) HALF CYCLE COMMON PATH PESSIMISM REMOVAL METHOD

(75) Inventor: Richard W. Smith, Fort Collins, CO (US)

(73) Assignee: Oracle America, Inc., Redwood Shores, CA (US)

( * ) Notice: Subject to any disclaimer, the term of this patent is extended or adjusted under 35 U.S.C. 154(b) by 342 days.

(21) Appl. No.: 12/039,833

(22) Filed: Feb. 29, 2008

(65) Prior Publication Data

US 2009/0222780 A1    Sep. 3, 2009

(51) Int. Cl.
    *G06F 9/45*     (2006.01)
    *G06F 17/50*     (2006.01)

(52) U.S. Cl. .................... 716/6; 716/4; 716/12; 703/19

(58) Field of Classification Search ............... 716/4, 716/6, 12; 703/19
See application file for complete search history.

(56) References Cited

U.S. PATENT DOCUMENTS

| | | | |
|---|---|---|---|
| 5,636,372 A | | 6/1997 | Hathaway et al. |
| 5,944,834 A | | 8/1999 | Hathaway |
| 7,117,466 B2 | | 10/2006 | Kalafala et al. |
| 7,131,090 B2 | * | 10/2006 | Wilcox et al. ............ 716/6 |
| 7,197,659 B2 | * | 3/2007 | Lim et al. ............ 713/401 |
| 7,269,812 B2 | * | 9/2007 | Darsow et al. ............ 716/6 |
| 7,636,905 B2 | * | 12/2009 | Darsow et al. ............ 716/6 |
| 2005/0066297 A1 | * | 3/2005 | Kalafala et al. ............ 716/6 |
| 2005/0183050 A1 | * | 8/2005 | Darsow et al. ............ 716/6 |
| 2006/0090150 A1 | * | 4/2006 | Kucukcakar et al. ......... 716/6 |
| 2007/0022397 A1 | * | 1/2007 | Darsow et al. ............ 716/6 |
| 2007/0113213 A1 | * | 5/2007 | Watanabe et al. ........... 716/10 |
| 2008/0209372 A1 | * | 8/2008 | Buck et al. ............ 716/6 |

\* cited by examiner

*Primary Examiner*—Paul Dinh
*Assistant Examiner*—Nha T Nguyen
(74) *Attorney, Agent, or Firm*—Meyertons, Hood, Kivlin, Kowert & Goetzel, P.C.; Stephen J. Curran

(57) ABSTRACT

A design tool for reducing half-cycle common path pessimism includes program instructions storable on a computer readable medium. The program instructions may be executable by a processor to receive a timing report for the IC. For each source clock path and destination clock path of each half-cycle timing path, the design tool may identify common circuit elements, and determine a process, voltage, and temperature (PVT) path delay value corresponding to PVT scaling of each identified common circuit element. The design tool may sum together the PVT path delay values of each identified common circuit element to obtain a total PVT compensation value. The design tool may also generate a new total skew value by subtracting the total PVT compensation value from a total compensated skew value, and generate a corrected timing report that includes the new total skew values.

17 Claims, 3 Drawing Sheets

… … …

HALF CYCLE COMMON PATH PESSIMISM REMOVAL METHOD

BACKGROUND OF THE INVENTION

1. Field of the Invention

This invention relates to electronic design automation tools and, more particularly, to pessimism reduction in timing and path delay analysis.

2. Description of the Related Art

During the design of an integrated circuit (IC), an automated design tool may be used to create the IC. The design flow includes a number of steps including schematic capture, circuit simulation, netlist creation, circuit layout, and others. In addition, to identify potential timing problems in the circuit, timing analysis is performed on the netlist. More particularly, the time that it takes signals such as clocks and data to propagate along a given path from a source to a destination is referred to as the path delay. Depending on parameters such as process, voltage, and temperature (PVT) the path delay may vary. There are a variety of ways of performing timing analysis. For example, static timing analysis and statistical timing analysis are both commonly used.

In an effort to identify potential worst-case path delays, timing models may use exhaustive searches of all possible parameter combinations. Alternatively, bounding methods may be used. In the bounding methods, the late delays and arrival times assuming the slowest possible conditions while assuming the fastest conditions for early delays and arrival times. While the bounding methods may provide a worst-case coverage, the analyses may provide overly pessimistic results.

Accordingly, there are conventional ways to reduce or remove pessimism from the timing analysis results, particularly in common paths. This removal process is sometimes referred to as common path pessimism removal (CPPR) or common reconvergent pessimism removal (CRPR). These methods typically remove or reduce PVT variation that has been added onto the gate delays in a clock path during analysis. For example, a timing path whose source and destination clock paths share common clock buffers may receive pessimism reduction by removing or reducing the PVT variation.

However, conventional tools that implement CPPR methods are restricted to correcting rising-edge-to-rising-edge, or falling-edge-to-falling-edge paths. For these types of paths, the pessimism removal process is straightforward. In contrast, circuits that use half-cycle clocking in which the timing path is rising-edge to falling-edge or vice versa, do not receive CPPR benefits, which can result in overly pessimistic timing. For example, in a half-cycle path, every picosecond (ps) of extra skew in the clocks may penalize the path slack by 2 ps. Thus, for circuits that contain a large number of logic levels (e.g., 20 or more levels), conventional CPPR tools may create a very pessimistic analysis.

SUMMARY

Various embodiments of a design tool, method and system for reducing half-cycle common path pessimism are disclosed. In one embodiment, an automated integrated circuit design tool includes program instructions storable on a computer readable medium. The program instructions may be executable by a processor to receive from a timing analyzer, for example, a timing report for the IC. The timing report may include a listing of circuit paths and corresponding path delay values. For each source clock path and destination clock path of each half-cycle timing path, the design tool may identify common circuit elements, and determine a process, voltage, and temperature (PVT) path delay value corresponding to (PVT) scaling of each identified common circuit element. In addition, the design tool may sum together the PVT path delay values of each identified common circuit element to obtain a total PVT compensation value. The design tool may also generate a new total skew value by subtracting the total PVT compensation value from a total compensated skew value, and generate a corrected timing report that includes the new total skew values for each half-cycle circuit path having common circuit elements.

Figure 1:
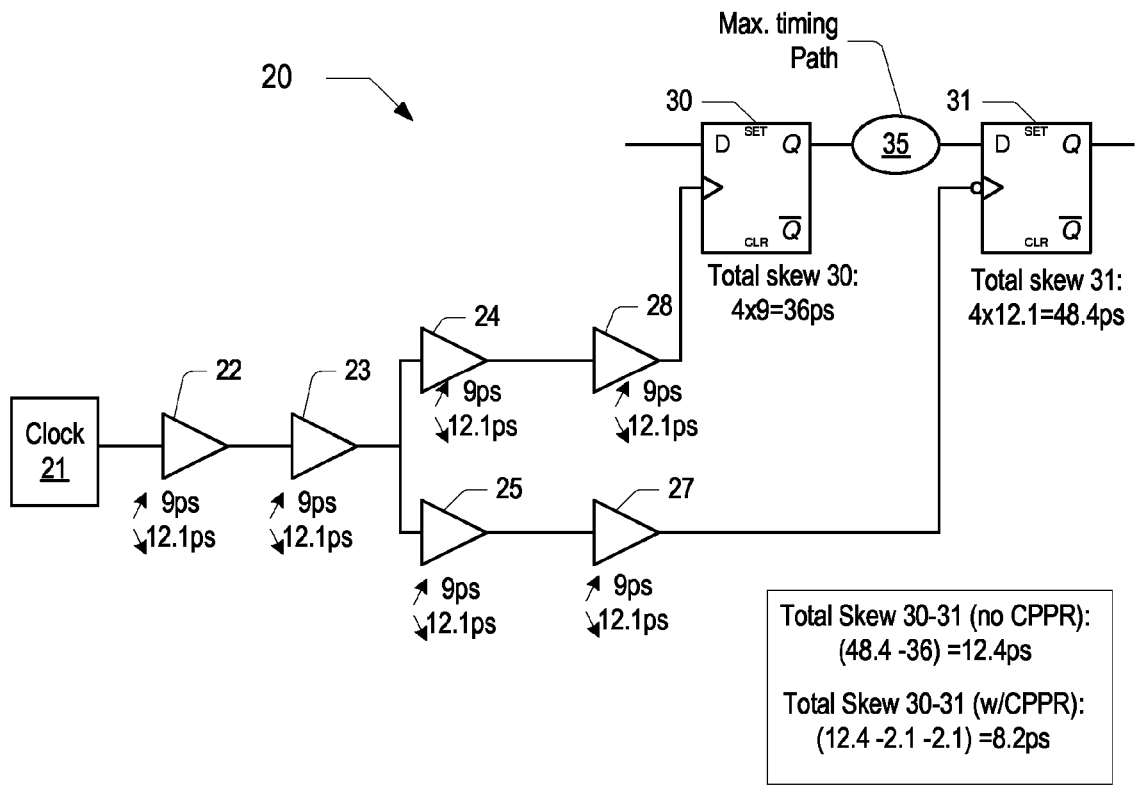
FIG. 1 is a diagram depicting an exemplary half-cycle timing path including source and destination clock paths.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. It is noted that the word "may" is used throughout this application in a permissive sense (i.e., having the potential to, being able to), not a mandatory sense (i.e., must).

DETAILED DESCRIPTION

As described above, there are many steps in the IC design flow. Accordingly, the design flow may use a number of design tools that may be task dependent. The design tools generally include software tools that run on a workstation or other type of computer system having processing capability. In some embodiments, depending on the design tool, some tasks may be performed by one tool, and other task may be performed by other tools. In other embodiments, one design tool may include a suite of design tools to handle the various steps in the design flow. The following description is meant to encompass all design tool implementations, as a given design tool may be a stand-alone tool or it may be part of design tool that includes a suite of design tools.

Turning now to FIG. 1, a circuit diagram depicting an exemplary circuit including source and destination clock paths is shown. The circuit 20 includes a clock source 21 coupled to a buffer 22, which is coupled to a buffer 23. The output of buffer 23 is coupled to buffer 24 and to buffer 25. The output of buffer 24 is coupled to buffer 28, which is turn coupled to the clock input of flip-flop (FF) 30. The output of buffer 25 is coupled to buffer 27, which is turn coupled to the negative edge clock input of FF 31. In addition, the data 'Q' output of FF 30 is coupled to a maximum timing data path 35, which is coupled to the 'D' input of FF 31. Thus, since the source clock for FF 30 is rising edge clock and the destination clock is a falling edge clock for FF31, the max. timing path 35 is a rising edge to falling edge or half-cycle path. It is noted that the max. timing path 35 may include any number of combinatorial logic elements.

As described above, during the design of an IC the timing analyzer portion of the design tool may add path delay to create worst-case scenarios in an effort to meet timing under all process corners. As such, PVT scaling (delay) may be added or taken away. In the illustrated embodiment, each clock buffer in the clock path is scaled with a process, temperature, and voltage (PVT) scaling factor of 10%. It is noted that due to variations in the transistor characteristics of the buffer, the rise and fall times may be different. As such, the rise time delay of each buffer is 10 ps unscaled, and 9 ps with the PVT scaling as shown in the parenthesis, while the fall time delay of each buffer is 11 ps unscaled and 12.1 ps with the PVT scaling applied. As shown, next to each clock buffer a rising arrow and a falling arrow are used to depict rising and falling edges respectively, and the scaled delay time associated with the buffer.

A timing analyzer may calculate the total skew in the source clock path to be the sum of the rising edge delays of buffers 22, 23, 24, and 28 or 36 ps at the clock input of FF 30. In the destination clock path, which includes buffers 22, 23, 25, and 27, the timing analyzer may calculate the total skew at the clock input of FF 31 to be 48.4 ps. Thus the total skew from rising edge to falling edge of FF30 to FF31 is 12.4 ps. However, as discussed above, this may be an overly pessimistic delay since clock buffers in a half-cycle path may have variations due to both the differences in the rise edge and fall edge delays, and differences in the PVT scaling. As described further below, the automated design tool described in FIG. 2 may reduce the pessimism that may be attributed to the PVT differences in the common circuit elements by recalculating the path delays and providing a new corrected timing report.

Figure 2:
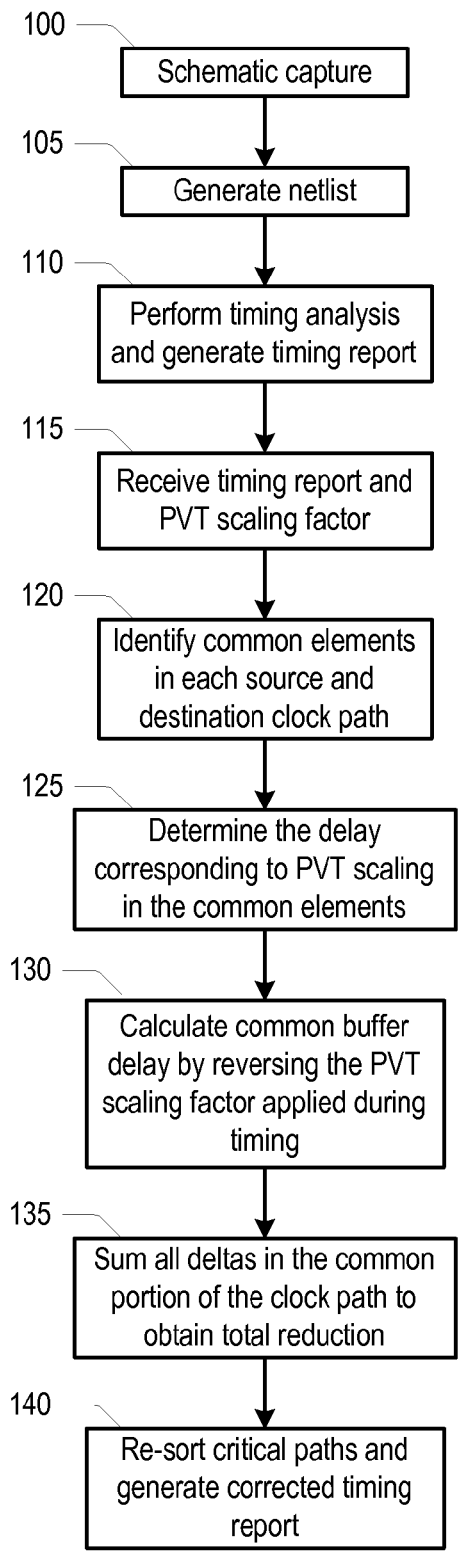
FIG. 2 is a flow diagram describing the operation of an embodiment of an IC design tool.

In FIG. 2, a flow diagram describing a design flow of an IC using an embodiment of an IC design tool that implements CPPR on half-cycle paths is shown. Referring collectively to FIG. 1 and FIG. 2, and beginning in block 100 of FIG. 2, a schematic representation of the integrated circuit is created or synthesized from a hardware description language representation such as RTL, for example. This is referred to as schematic capture. In addition, the RTL circuit representation may be synthesized into a netlist by a synthesis tool (block 105). The netlist includes a listing of the circuit components and their connectivity. The netlist may also include or refer to descriptions of the circuit components. The netlist may be input to a timing analyzer design tool.

The timing analyzer may analyze all clock and data paths in the IC design to ensure that that design meets timing. Depending on the type of analysis, the timing analyzer may take into account all the resistor-capacitor (RC) time constants of the wires, the wire thicknesses, the distances between components, the intrinsic delays of each component, and the like. As described above, the timing analyzer may also take into account device performance variation characteristics such as PVT variations. In so doing, the timing analyzer may add delays to some paths and shorten delays in other paths depending on whether the paths are source paths or destination paths. The timing analyzer may generate a timing report that includes a listing of all circuit paths and their associated path delays (block 110). The timing report may list the paths starting with the most critical paths first. A critical path is typically a path that has the most delay.

The CPPR tool portion of the design tool may receive the timing report output of the timing analyzer as well as the PVT scaling factor used by the timing analyzer during delay compensation (block 115). For example, as mentioned above in the description of FIG. 1, the PVT scaling factor is +/−10%. The CPPR tool may go through the timing analyzer report path by path to identify common circuit elements in each source and destination clock path in those paths that are half-cycle paths (block 120). For example, in FIG. 1 clock buffers 22 and 23 are common elements. For common elements such as these, the CPPR tool determines the delay corresponding to the PVT scaling (block 125). In the example shown in FIG. 1, the PVT delta for each buffer corresponds to the difference between the PVT corrected rise time and the standard fall time, added to the difference between the PVT corrected fall time and the standard fall time. Thus the PVT delta=(12.1 ps−11 ps)+(10 ps−9 ps), or 2.1 ps.

The CPPR tool may remove or reverse the PVT scaling to calculate the common buffer delay that will be used for each common buffer in a corrected timing report (block 130). This may be done by summing all the PVT deltas to obtain the total reduction value, and then subtracting that reduction value from to the total skew for the timing path (block 135). As shown in the example in FIG. 2, the timing analyzer assigned a total skew of 12.4 ps from clock-to-Q of max. timing path 35 with no CPPR compensation. However, the corrected total skew with CPPR compensation is 12.4 ps−4.2 ps=8.2 ps. The CPPR tool may perform these steps for each timing path in the timing report that is a half-cycle path. Once all timing paths are done, the CPPR tool may re-sort the paths, by listing most critical paths first, and generate a corrected timing report with the new skew values (block 140).

As described above, the design tools and specifically the CPPR design tool may comprise program instructions. The program instructions may be written in any programming language. The CPPR design tool and the other EDA tools may comprise program instructions that execute on one or more processors of a computer system. As such, a block diagram of one embodiment of a computer system that may be used to implement the design tools is shown in FIG. 3.

Figure 3:
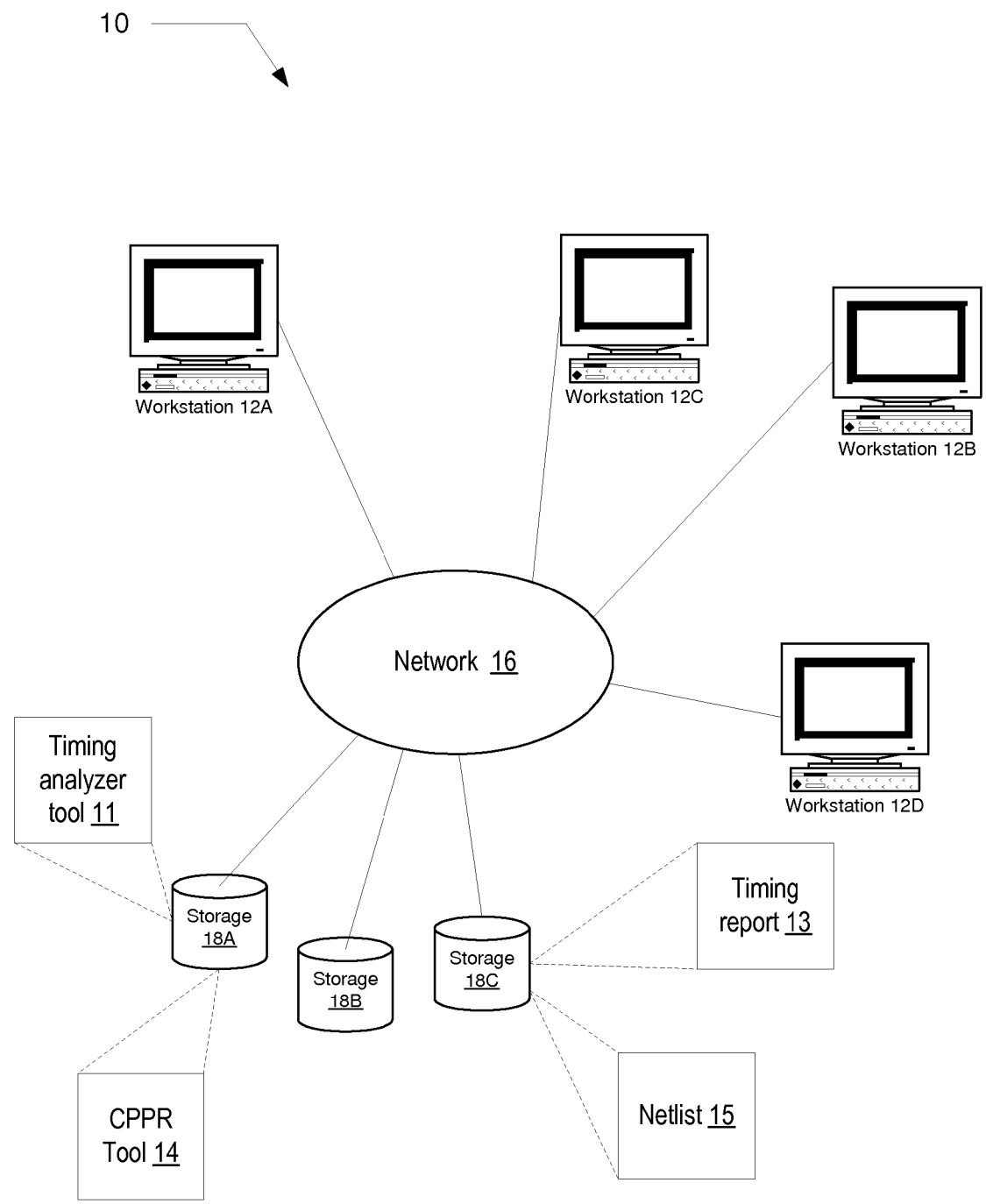
FIG. 3 is a block diagram of one embodiment of a computer system used to implement an automated IC design tool.

Turning to FIG. 3, computer system 10 includes a plurality of workstations designated 12A through 12D. The workstations are coupled together through a network 16 and to a plurality of storages designated 18A through 18C. In one embodiment, each of workstations 12A-12D may be representative of any standalone computing platform that may include, for example, one or more processors, local system memory including any type of random access memory (RAM) device, monitor, input output (I/O) means such as a network connection, mouse, keyboard, monitor, and the like (many of which are not shown for simplicity).

In one embodiment, storages 18A-18C may be representative of any type of mass storage device such as hard disk systems, optical media drives, tape drives, ram disk storage, and the like. As such, the program instructions comprising the design tools may be stored within any of storages 18A-18C and loaded into the local system memory of any of the workstations during execution. As an example, as shown in FIG. 3, the timing analyzer tool 11 and the CPPR tool 14 are shown stored within storage 18A, while the netlist 15 and the timing report 13 are stored within storage 18C. Additionally, the program instructions may be stored on a portable/removable storage media. The program instructions may be executed directly from the removable media or transferred to the local system memory or mass storages for subsequent execution. As such, the local system memory and the mass storages may be referred to as computer readable mediums. The program instructions may be executed by the one or more processors on a given workstation or they may be executed in a distributed fashion among the workstations, as desired.

It is noted that although the computer system shown in FIG. 3 is a networked computer system, it is contemplated that in other embodiments, each workstation may also include local mass storage. In such embodiments, the program instructions and the results of the design tools may be stored locally. Further, it is contemplated that the program instructions may be executed on a standalone computer such as a personal computer that includes local mass storage and a system memory.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method for automatically reducing common path pessimism for half-cycle timing paths of an integrated circuit (IC), the method comprising:
a computer system:
receiving a timing report for the IC, wherein the timing report includes a listing of circuit paths and corresponding path delay values;
for each source clock path and destination clock path of each half-cycle timing path:
identifying common circuit elements;
determining a process, voltage, and temperature (PVT) path delay value corresponding to PVT scaling of each identified common circuit element by summing: a difference between a PVT compensated rise time delay and an uncompensated rise time delay, and a difference between a PVT compensated fall time delay and an uncompensated fall time delay;
summing together PVT path delay values of each identified common circuit element to obtain a total PVT compensation value;
generating a new total skew value by subtracting the total PVT compensation value from a total compensated skew value by taking a difference between: a summation of edge delays corresponding to a first clock edge of all circuit elements in the source clock path, and a summation of edge delays corresponding to a clock edge opposite that of the first clock edge of all circuit elements in the destination clock path; and
generating a corrected timing report that includes a new total skew values for each half-cycle circuit path having common circuit elements.

2. The method as recited in claim 1, wherein the total compensated skew value comprises a difference between: a summation of rising edge delays of all circuit element in the source clock path, and a summation of falling edge delays of all circuit element in the destination clock path.

3. The method as recited in claim 1, wherein the total compensated skew value comprises a difference between: a summation of falling edge delays of all circuit element in the source clock path, and a summation of rising edge delays of all circuit element in the destination clock path.

4. The method as recited in claim 1, wherein the timing report is an output from a timing analyzer design tool and comprises the listing of circuit paths and corresponding path delay values, wherein circuit paths having the most critical path delays are listed before other circuit paths.

5. The method as recited in claim 1, further comprising receiving a PVT scaling factor corresponding to the PVT compensation applied during creation of the timing report.

6. The method as recited in claim 1, further comprising reordering the corrected timing report, wherein circuit paths having the most critical path delays are listed before other circuit paths.

7. An automated integrated circuit design tool for reducing common path pessimism for half-cycle timing paths, the tool comprising program instructions storable on a computer readable medium, and executable by a processor to:
receive a timing report for the IC, wherein the timing report includes a listing of circuit paths and corresponding path delay values;
for each source clock path and destination clock path of each half-cycle timing path:
identify common circuit elements;
determine a process, voltage, and temperature (PVT) path delay value corresponding to PVT scaling of each identified common circuit element by summing: a difference between a PVT compensated rise time delay and an uncompensated rise time delay, and a difference between a PVT compensated fall time delay and an uncompensated fall time delay;
sum together PVT path delay values of each identified common circuit element to obtain a total PVT compensation value;
generate a new total skew value by subtracting the total PVT compensation value from a total compensated skew value by taking a difference between: a summation of edge delays corresponding to a first clock edge of all circuit elements in the source clock path, and a summation of edge delays corresponding to a clock edge opposite that of the first clock edge of all circuit elements in the destination clock path; and
generate a corrected timing report that includes a new total skew values for each half-cycle circuit path having common circuit elements.

8. The design tool as recited in claim 7, wherein the total compensated skew value comprises a difference between: a summation of rising edge delays of all circuit element in the source clock path, and a summation of falling edge delays of all circuit element in the destination clock path.

9. The design tool as recited in claim 7, wherein the total compensated skew value comprises a difference between: a summation of falling edge delays of all circuit element in the source clock path, and a summation of rising edge delays of all circuit element in the destination clock path.

10. The design tool as recited in claim 7, wherein the timing report is an output from a timing analyzer design tool and comprises the listing of circuit paths and corresponding path delay values, wherein circuit paths having the most critical path delays are listed before other circuit paths.

11. The design tool as recited in claim 7, wherein the program instructions are further executable by the processor to receive a PVT scaling factor corresponding to the PVT compensation applied during creation of the timing report.

12. The design tool as recited in claim 7, wherein the program instructions are further executable by the processor to reorder the corrected timing report, wherein circuit paths having the most critical path delays are listed before other circuit paths.

13. A system comprising:
a memory configured to store program instructions which implement an automatic integrated circuit (IC) design tool for reducing common path pessimism for half-cycle timing paths of an IC;
a processor coupled to the memory and configured to execute the program instructions to:
receive a timing report for the IC, wherein the timing report includes a listing of circuit paths and corresponding path delay values; and
for each source clock path and destination clock path of each half-cycle timing path:
identify common circuit elements;
determine a process, voltage, and temperature (PVT) path delay value corresponding to PVT scaling of each identified common circuit element by summing: a difference between a PVT compensated rise time delay and an uncompensated rise time delay, and a difference between a PVT compensated fall time delay and an uncompensated fall time delay;

sum together PVT path delay values of each identified common circuit element to obtain a total PVT compensation value;

generate a new total skew value by subtracting the total PVT compensation value from a total compensated skew value by taking a difference between: a summation of edge delays corresponding to a first clock edge of all circuit elements in the source clock path, and a summation of edge delays corresponding to a clock edge opposite that of the first clock edge of all circuit elements in the destination clock path; and generate a corrected timing report that includes a new total skew values for each half-cycle circuit path having common circuit elements.

14. The system as recited in claim 13, wherein the total compensated skew value comprises a difference between: a summation of rising edge delays of all circuit element in the source clock path, and a summation of falling edge delays of all circuit element in the destination clock path.

15. The system as recited in claim 13, wherein the total compensated skew value comprises a difference between: a summation of falling edge delays of all circuit element in the source clock path, and a summation of rising edge delays of all circuit element in the destination clock path.

16. The system as recited in claim 13, wherein the timing report is an output from a timing analyzer design tool and comprises the listing of circuit paths and corresponding path delay values, wherein circuit paths having the most critical path delays are listed before other circuit paths.

17. The system as recited in claim 13, wherein the program instructions are further executable by the processor to receive a PVT scaling factor corresponding to the PVT compensation applied during creation of the timing report.

* * * * *